United States Patent [19]

Wu

[11] Patent Number: 5,994,178
[45] Date of Patent: Nov. 30, 1999

[54] METHOD OF FABRICATING CMOS TRANSISTORS WITH A PLANAR SHALLOW TRENCH ISOLATION

[75] Inventor: Shye-Lin Wu, Hsinchu, Taiwan

[73] Assignee: Texas Instruments - Acer Incorporated, Hsinchu, Taiwan

[21] Appl. No.: 09/001,978

[22] Filed: Dec. 31, 1997

[51] Int. Cl.⁶ .............................................. H01L 21/8238
[52] U.S. Cl. .................... 438/221; 438/199; 438/223; 438/224; 438/232
[58] Field of Search ..................... 438/199, 218, 438/221, 223, 224, 227, 228, 229, 232

[56] References Cited

U.S. PATENT DOCUMENTS

| | | | |
|---|---|---|---|
| 4,923,821 | 5/1990 | Namose | 438/437 |
| 5,256,593 | 10/1993 | Iwai | 148/DIG. 50 |
| 5,750,424 | 5/1998 | Choi et al. | 438/199 |
| 5,851,900 | 12/1998 | Chu et al. | 438/224 |
| 5,877,066 | 3/1999 | Stolmeijer et al. | 438/424 |

OTHER PUBLICATIONS

Asanga H. Perera et al., Trench Isolation for 0.45 μm Active Pitch and Below, 1995 IEEE, pp. 679–682.
Pierre C. Fazan et al., A Highly Manufacturable Trench Isolation Process for Deep Submicron DRAMs, 1993 IEEE, pp. 57–60.
S. Nag et al., Comparative Evaluation of Gap–Fill Dielectrics in Shallow Trench Isolation for Sub–0.25 μm Technologies, 1996 IEEE, pp. 841–844.
Juing–Yi Cheng et al., A Novel Planarization of Oxide–Filled Shallow–Trench Isolation, J. Electrochem. Soc., vol. 144, No. 1, Jan. 1997, pp. 315–319.
Ching–Fa Yeh et al., The Physicochemical Properties and Growth Mechanism of Oxide ($SiO_{2-x}F_x$) by Liquid Phase Deposition with $H_2O$ Addition Only, J. Electrochem. Soc., vol. 141, No. 11, Nov. 1994, pp. 3177–3181.

*Primary Examiner*—Trung Dang
*Attorney, Agent, or Firm*—Harness, Dickey & Pierce, P.L.C.

[57] ABSTRACT

The present invention discloses a method of forming CMOS transistors with planar shallow trench isolations. Before a twin well being formed, a pad oxide film and a nitride film are sequentially deposited on a silicon substrate. When a photoresist film is patterned to define active regions, the silicon substrate is recessed by using the patterned photoresist film as a mask. A liquid-phase-deposition oxide (LPD) film is then grown on the recess structure for shallow trench isolations. Next, a high temperature annealing procedure is performed to densify the LPD oxide film. Finally, when the pad oxide and the nitride films are removed, processes for fabricating CMOS transistors can be continued on the silicon substrate.

19 Claims, 3 Drawing Sheets

METHOD OF FABRICATING CMOS TRANSISTORS WITH A PLANAR SHALLOW TRENCH ISOLATION

BACKGROUND OF THE INVENTION

1. Field of the Invention

The invention relates to a method of fabricating CMOS (Complementary Metal-Oxide-Semiconductor) transistors, and more particularly, to a method of fabricating CMOS transistors with planar shallow trench isolations.

2. Description of the Prior Art

In the present days, shallow trench isolation (STI) structures are recognized as an important configuration to fabricate CMOS transistors because the STI technologies offer lots of advantages. For example, a bird's beak is entirely eliminated and channel-stop dopant redistribution is reduced, and the structure is fully recessed to offer the potential of a completely planar surface when compared with the local oxidation of silicon (LOCOS) technology. In addition, the problem of field-oxide thinning in narrow isolation spaces does not occur. Furthermore, the threshold voltage is constant as a function of channel width because the narrow-channel effect found in LOCOS is also eliminated.

Because the STI structures have attractive advantages, there are amounts of processes continuously disclosed. Perera et al proposed an isolation method using oxide filled shallow trenches focus primarily at isolating CMOS devices and which has been developed for 0.25 μm SRAM (Static Random Access Memory) fabrication (refer to "Trench Isolation for 0.45 μm Active Pitch and Below" in IEDM Tech. Dig. P.679, 1995.) Fazan et al proposed an STI process that a vertical B field implant and forming of disposable spacers are combined to avoid devices reverse narrow width effects (refer to "A Highly Manufacturable Trench Isolation Process for Deep Submicron DRAMs" in IEDM Tech. Dig., p. 57, 1993.) Nag et al show an ICP (Inductive Coupled) HDP—(High Density Plasma) CVD (Chemical Vapor Deposition) process to obtain a low budget and high throughput approach as well as provide good gap-fill, low moisture uptake at 0.3 μm spacing (refer to "Comparative Evaluation of Gap-Fill Dielectrics in Shallow Trench Isolation for Sub-0.25 μm Technologies" in IEDM Tech. Dig., p841, 1996.)

Typically, a relative shallow trench isolation is first etched to form a recess structure in the silicon substrate, and then refilled with an insulator material. The surface is planarized after refill to complete the isolation structure. However, the STI process is hard to form a planar trench isolation (refer to "A Novel Planarization of Oxide-Filled Shallow-Trench Isolation" in J. Electrochem. Soc., vol., 144, p 315, 1997 disclosed by Cheng et al.), and usually, the STI technology requires a complicated planarization procedure. Conventionally, a combination of dry etch and CMP (Chemical Mechanical Polishing) with an extra mask to prevent dishing in wide field regions has been proposed to planarize a device surface. Another traditional approach applying only dry etch planarization requires a LOCOS isolation in wide field areas that will significantly increase the process complexity. A requirement has been arisen to disclose an STI process that forms CMOS transistors with planar surface and lower budgets.

SUMMARY OF THE INVENTION

Accordingly, the present invention discloses a method to form CMOS transistors with planar shallow trench isolations. After a twin well being formed, pad oxide/nitride films are deposited on a silicon substrate. When a photoresist film is patterned to define active regions, the silicon substrate is recessed by using the patterned photoresist film as a mask. Then, a liquid-phase-deposition (LPD) oxide film is grown for shallow trench isolations. A high temperature annealing procedure is then performed to densify the LPD oxide film. Finally, the CMOS transistors are fabricated on the silicon substrate after the pad oxide/nitride films are removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
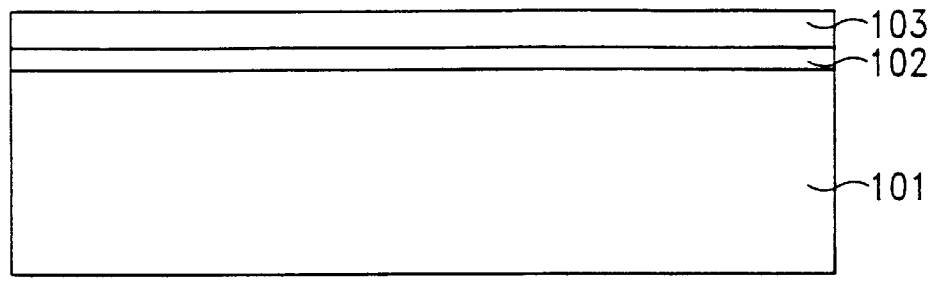
FIG. 1 is a cross section of a silicon substrate representative of when a silicon nitride film is formed over a pad oxide film on the silicon substrate.
Figure 2:
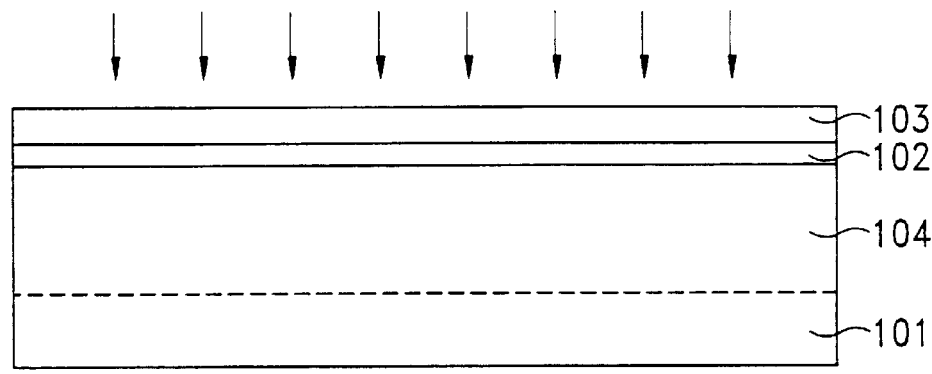
FIG. 2 illustrates a cross-sectional view of the silicon substrate representative of when phosphorous ions are implanted to form an N-well in the silicon substrate.
Figure 3:
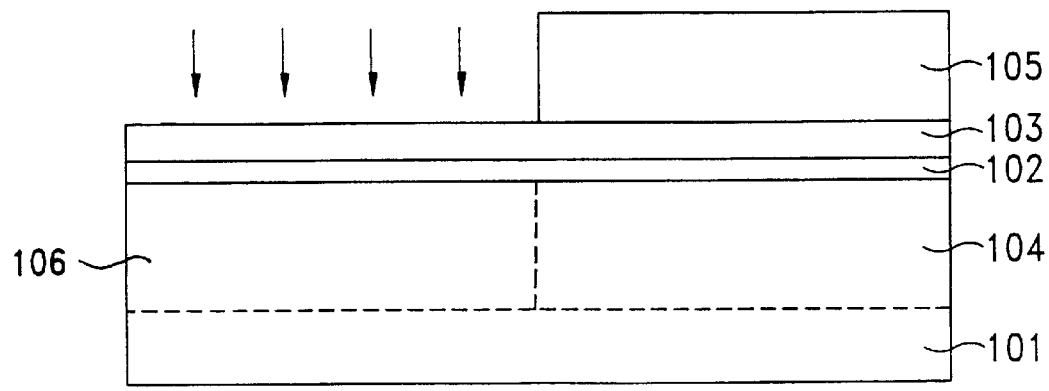
FIG. 3 illustrates a cross-sectional view of the silicon substrate representative of when boron ions are implanted to form a P-well in the silicon substrate by using photoresist film as a mask covered the N-well.

FIG. 1 is a cross section of a silicon substrate 101 representative of when a nitride film 103 with a thickness of about 500 to 2000 Å (angstrom) is formed over a pad oxide film 102. The pad oxide layer 102 is composed of silicon dioxide with a thickness of about 30 to 500 Å. FIG. 2 illustrates a cross-sectional view representative of when phosphorous ions are implanted to form an N-well 104 in the silicon substrate 101. The depth of the N-well 104 is about 0.3 to 3.0 μm, and the implanted phosphorous ions are at an energy about 200 KeV to 5.0 MeV, and at a dose between 1E12 to 1E14 atoms/cm$^2$. FIG. 3 illustrates a cross-sectional view representative of when boron ions are implanted to form a P-well 106 in the silicon substrate 101 by using photoresist film 105 as a mask covered the N-well 104. The implanted boron ions are at an energy about 200 KeV to 4.0 MeV, and at a dose between 1E12 to 1L14 atoms/cm$^2$.

Figure 4:
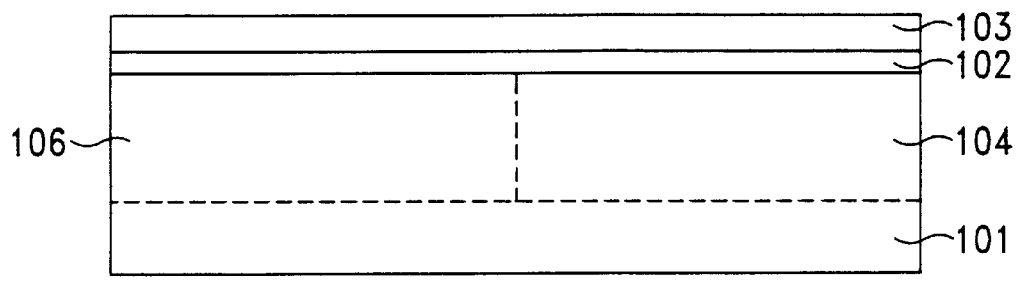
FIG. 4 represents a cross section illustrative of when the photoresist film is removed.
Figure 5:
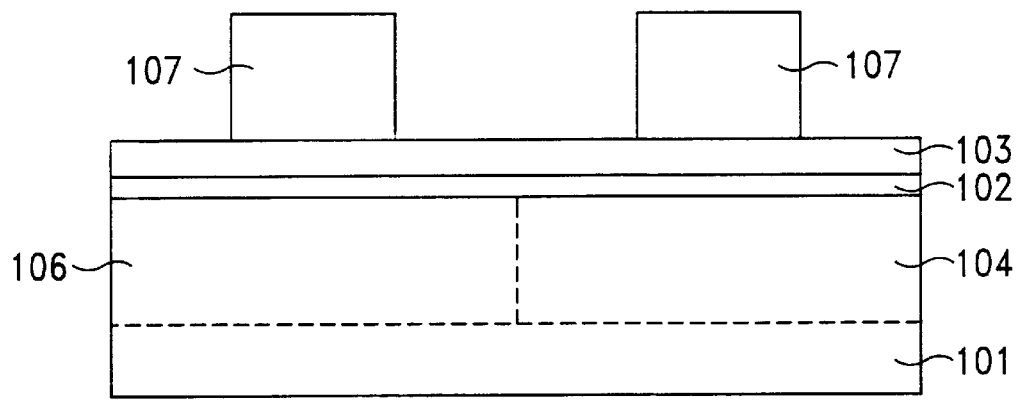
FIG. 5 demonstrates a cross section representative of when another photoresist film is completely patterned on the nitride film for defining active regions.
Figure 6:
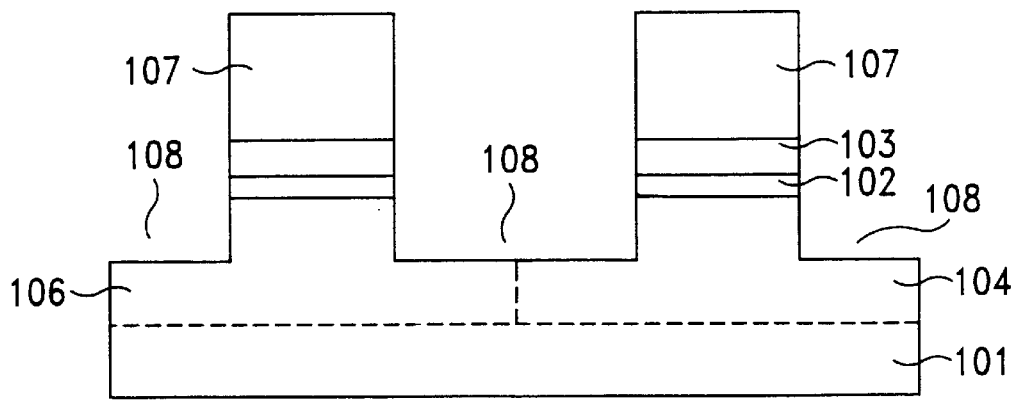
FIG. 6 shows a cross-sectional view illustrative of when the silicon substrate is recessed by using the photoresist film as a mask.

Referring to FIG. 4, which represents a cross section illustrative of when the photoresist film 105 is striped. FIG. 5 demonstrates a cross section representative of when a photoresist film 107 is completely patterned on the nitride film 103 to define active regions. Then, a recess procedure is performed to form a recess structure 108 with a depth of about 0.1 to 1.0 μm on the silicon substrate 101 by using the photoresist film 107 as a mask. Please note that conventional processes for forming recess structures can be applied in the invention. FIG. 6 shows a cross-sectional view illustrative of when the silicon substrate is completely recessed. Next, a liquid-phase-deposition (LPD) oxide film 109 is grown with a thickness of about 0.1 to 1.5 μm to fill the recess structure 108. LPD is a room-temperature method for $SiO_2$ formation, and the LPD oxide films can be obtained by adding either $H_3BO_3$ or Al to a hydrofluosilicic acid ($H_3SiF_6$) solution saturated with silica. An article titled "The Physicochemical Properties and Growth Mechanism of Oxide ($SiO_{2-}F_x$) by Liquid Phase Deposition with $H_2O$ Addition Only" disclosed by Yen et al. in J. Electrochem. Soc., vol. 141, p.3177, 1994 proposed the mechanism while growing the LPD oxide films.

Figure 7:
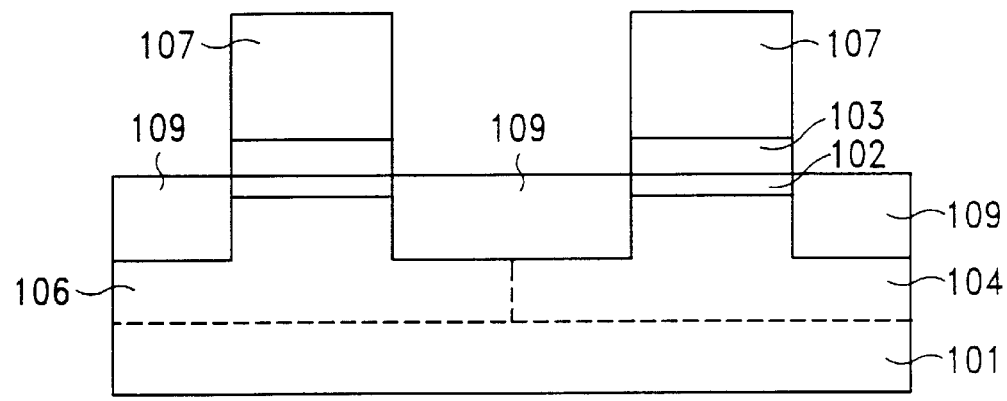
FIG. 7 is a cross section representative of when a liquid-phase-deposition (LPD) oxide layer is grown on the recess structure of the silicon substrate.
Figure 8:
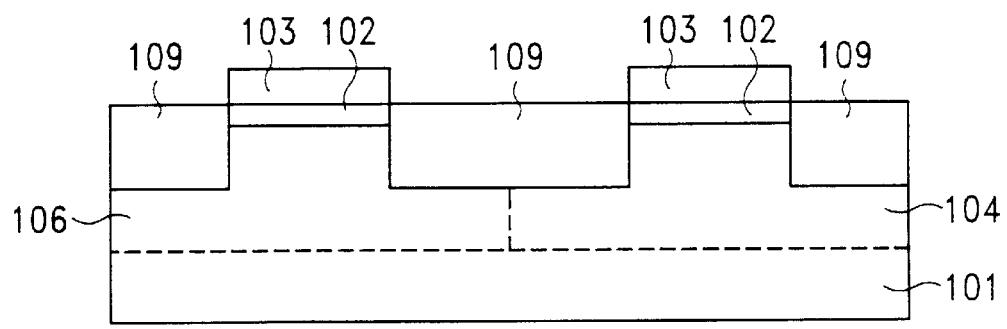
FIG. 8 depicts a cross section of the silicon substrate that a high temperature anneal is performed to densify the LPD oxide layer after the photoresist is striped.

FIG. 7 shows a cross section representative of when the LPD oxide film 109 is completely grown. Finally, a high temperature $O_2$ anneal is performed to densify the LPD oxide layer 109 after the photoresist film 107 is removed. The high temperature $O_2$ anneal performs under a circumstance having a temperature in a range of 700 to 1100°C. FIG. 8 depicts a cross section after the high temperature anneal is performed to densify the LPD oxide layer 109. Obviously, the method proposed in the present invention can be easily achieved by using a simpler process and lower thermal budget than the conventional STI technologies.

Figure 9:
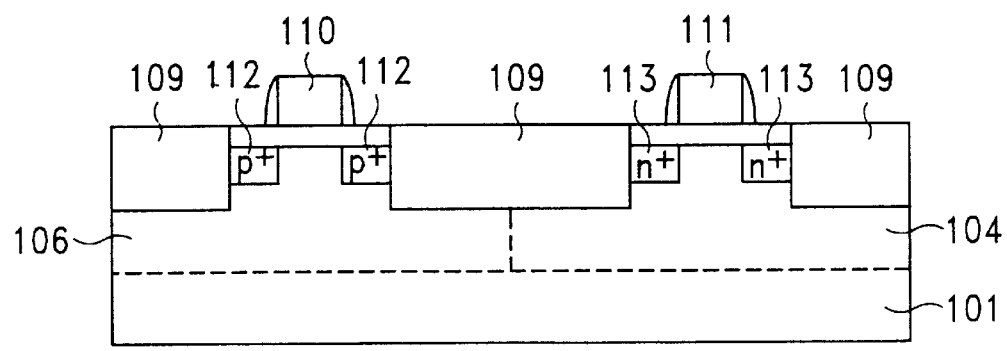
FIG. 9 is a cross section of the silicon substrate after a CMOS transistor is fabricated on the silicon substrate.

When the isolation regions are completely made for semiconductor devices, sequence processes for fabricating CMOS transistors are thus continued. For example, in FIG. 9 that shows a cross section illustrative of when a gate structure 110, and p+ layer 112 as source and drain for the PMOSFET, and forming a gate structure 111, and n+ layer 113 as source and drain for the NMOSFET.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a trench structure for CMOS (Complementary Metal-Oxide-Semiconductor) transistors, said method comprising the steps of:

forming a pad oxide film on a substrate;

forming a silicon nitride film on said pad oxide film;

performing a first ion implantation to form a first well film under said pad oxide film in said substrate;

patterning a photoresist film on said nitride film to cover portions of said substrate;

performing a second ion implantation by using said patterned photoresist film as a mask to form a second well film under said pad oxide film and against said first well film in said substrate;

stripping said photoresist film;

patterning said nitride film and said pad oxide film to define an active region;

recessing said substrate to form a recess structure on said substrate by using said patterned nitride film and said pad oxide film as masks;

depositing an oxide film to fill said recess structure;

performing a high temperature anneal to densify said oxide film;

removing said silicon nitride film; and removing said pad oxide film.

2. The method according to claim 1, wherein said first well film is treated as an N-well with a thickness of about 0.3 to 3.0 μm.

3. The method according to claim 2, wherein said N-well is doped phosphorous ions at an energy between about 200 KeV to 5.0 MeV, at a dose between about 1E12 to 1E14 atoms/$cm^2$.

4. The method according to claim 2, wherein said second well is treated as a P-well with a thickness of about 0.3 to 3.0 μm.

5. The method according to claim 4, wherein said P-well is doped boron ions at an energy between about 200 KeV to 4.0 MeV, at a dose between about 1E12 to 1E14 atoms/$cm^2$.

6. The method according to claim 1, wherein said recess structure is formed with a depth of about 0.1 to 1.0 μm.

7. The method according to claim 1, wherein said oxide layer is a liquid-phase-deposition oxide film.

8. The method according to claim 7, wherein a thickness of said liquid-phase-deposition oxide film is about 0.1 to 1.5 μm.

9. The method according to claim 7, wherein said liquid-phase-deposition oxide film is formed by adding $H_3BO_3$ or Al to a hydrofluosilicic acid ($H_3SiF_6$) solution saturated with silica.

10. The method according to claim 1, wherein said high temperature anneal is performed under a temperature in a range of 700 to 1100° C.

11. A method of forming a trench structure for CMOS (Complementary Metal-Oxide-Semiconductor) transistors, said method comprising the steps of:

forming a pad oxide film on a substrate;

forming a silicon nitride film on said pad oxide film;

performing a phosphorous ion implantation to form an N-well under said pad oxide film in said substrate;

patterning a photoresist film on said nitride film to cover portions of said substrate;

performing a boron ion implantation by using said patterned photoresist film as a mask to form a P-well under said pad oxide film and against said N-well in said substrate;

stripping said photoresist film;

patterning said nitride film and said pad oxide film to define an active region;

recessing said substrate to form a recess structure on said substrate by using said patterned nitride film and said pad oxide film as masks;

depositing a liquid-phase-deposition oxide film to fill said recess structure;

performing a high temperature anneal to densify said oxide film;

removing said silicon nitride film; and removing said pad oxide film.

12. The method according to claim 11, wherein a thickness of said N-well is about 0.3 to 3.0 μm.

13. The method according to claim 12, wherein said phosphorous ion implantation is doped by phosphorous ions at an energy between about 200 KeV to 5.0 MeV, at a dose between about 1E12 to 1E14 atoms/$cm^2$.

14. The method according to claim 12, wherein a thickness of said P-well is about 0.3 to 3.0 μm.

15. The method according to claim 14, wherein said boron ion implantation is doped by boron ions at an energy between about 200 KeV to 4.0 MeV, at a dose between about 1E12 to 1E14 atoms/cm$^2$.

16. The method according to claim 11, wherein said recess structure is formed with a depth of about 0.1 to 1.0 µm.

17. The method according to claim 11, wherein a thickness of said liquid-phase-deposition oxide film is about 0.1 to 1.5 µm.

18. The method according to claim 11, wherein said liquid-phase-deposition oxide film is formed by adding $H_3BO_3$ or Al to a hydrofluosilicic acid ($H_3SiF_6$) solution saturated with silica.

19. The method according to claim 11, wherein said high temperature anneal is performed under a temperature in a range of 700 to 1100° C.

* * * * *